(12) United States Patent
Sugita et al.

(10) Patent No.: US 10,354,896 B2
(45) Date of Patent: Jul. 16, 2019

(54) POSITION DETECTION SYSTEM AND PROCESSING APPARATUS

(71) Applicant: TOKYO ELECTRON LIMITED, Tokyo (JP)

(72) Inventors: Kippei Sugita, Miyagi (JP); Kenji Nagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/718,066

(22) Filed: Sep. 28, 2017

(65) Prior Publication Data
US 2018/0090354 A1    Mar. 29, 2018

(30) Foreign Application Priority Data
Sep. 29, 2016 (JP) .................................. 2016-191909

(51) Int. Cl.
*G01S 17/06* (2006.01)
*H01L 21/67* (2006.01)

(52) U.S. Cl.
CPC ........ *H01L 21/67259* (2013.01); *G01S 17/06* (2013.01)

(58) Field of Classification Search
CPC .................................................. H01L 21/67265
See application file for complete search history.

(56) References Cited

U.S. PATENT DOCUMENTS

| 6,244,121 | B1 | 6/2001 | Hunter | |
|---|---|---|---|---|
| 6,468,816 | B2 | 10/2002 | Hunter | |
| 2007/0216893 | A1* | 9/2007 | Yasuda | ............... G03F 7/70341 355/72 |

\* cited by examiner

*Primary Examiner* — Tri T Ton
*Assistant Examiner* — Rebecca C Bryant
(74) *Attorney, Agent, or Firm* — Rothwell, Figg, Ernst & Manbeck, P.C.

(57) ABSTRACT

There is provided a position detection system for use in a processing apparatus including a mounting table configured to mount thereon a disc-shaped target object and a focus ring surrounding a periphery of the mounting table. The system includes a light source configured to generate measurement light, three or more optical elements configured to emit the measurement light as emission light and receive reflected light, a driving unit configured to move each of the optical elements such that a scanning range from the focus ring to the target object is scanned, and a control unit configured to obtain positional relation between the focus ring and the target object based on the reflected light in the scanning range of each of the optical elements.

15 Claims, 12 Drawing Sheets

POSITION DETECTION SYSTEM AND PROCESSING APPARATUS

CROSS-REFERENCE TO RELATED APPLICATIONS

This application claims priority to Japanese Patent Application No. 2016-191909 filed on Sep. 29, 2016, the entire contents of which is incorporated herein by reference.

FIELD OF THE INVENTION

The disclosure relates to a position detection system and a processing apparatus.

BACKGROUND OF THE INVENTION

A processing apparatus for performing plasma processing is used in manufacturing electronic devices such as semiconductor devices (see, e.g., U.S. Pat. Nos. 6,468,816 and 6,244,121). Each of processing apparatuses disclosed in U.S. Pat. Nos. 6,468,816 and 6,244,121 includes a processing chamber and a mounting table. The mounting table is provided in the processing chamber and holds a target object mounted thereon. In such a processing apparatus, the target object is transferred by a transfer unit to be mounted on the mounting table and processed by a plasma of a processing gas which is generated in the processing chamber. The transfer unit detects a transfer state by transferring a sensor device having the same shape as that of the target object.

However, in the processing apparatuses and the transfer units disclosed in U.S. Pat. Nos. 6,468,816 and 6,244,121, it is not possible to detect a position of the target object mounted on the mounting table, i.e., positional relation between the mounting table and the target object. Therefore, the transfer units disclosed in U.S. Pat. Nos. 6,468,816 and 6,244,121 cannot determine whether or not the target object has been mounted at a predetermined target position on the mounting table.

In the processing apparatus, a focus ring may be provided on the mounting table to surround a peripheral portion of the target object to improve in-plane uniformity of the processing of the target object. The focus ring is worn by the plasma and needs to be replaced. When the focus ring is replaced, an assembly error of the focus ring may be generated. When the assembly error of the focus ring is generated, the positional relation between the target object and the focus ring becomes different from that before the replacement of the focus ring even if the target object is mounted at the predetermined target position on the mounting table. Therefore, the in-plane uniformity of the processing of the target object may deteriorate.

SUMMARY OF THE INVENTION

In view of the above, the disclosure provides a processing apparatus and a position detection system capable of detecting positional relation between a target object and a component of the processing apparatus, such as a mounting table, a focus ring or the like.

In accordance with an aspect, there is provided a position detection system for use in a processing apparatus including a mounting table configured to mount thereon a disc-shaped target object and a focus ring surrounding a periphery of the mounting table, the position detection system including: a light source configured to generate measurement light; three or more optical elements configured to emit the measurement light generated by the light source as emission light and receive reflected light; a driving unit configured to move each of the optical elements such that a scanning range from the focus ring to the target object mounted on the mounting table is scanned; and a control unit configured to obtain positional relation between the focus ring and the target object mounted on the mounting table based on the reflected light in the scanning range of each of the optical elements.

In accordance with another aspect, there is provided a position detection system for use in a processing apparatus including a mounting table configured to mount thereon a disc-shaped target object having an inclined peripheral portion, the position detection system including: a light source configured to generate measurement light; three or more optical elements configured to emit the measurement light generated by the light source as emission light and receive reflected light; and a control unit configured to determine whether or not the target object is located at a target position on the mounting table based on the reflected light incident on each of the optical elements, wherein each of the optical elements is arranged such that the emission light is emitted to a target position of the peripheral portion of the target object.

In accordance with still another aspect, there is provided a position detection system for use in a processing apparatus including a mounting table configured to mount thereon a disc-shaped target object having an inclined peripheral portion, the position detection system including: a light source configured to generate measurement light; three or more optical elements configured to emit the measurement light generated by the light source as emission light and receive reflected light; and a control unit configured to determine whether or not the target object is located at a target position on the mounting table based on the reflected light incident on each of the optical elements, wherein each of the optical elements is arranged such that the emission light is emitted to a position inwardly separated from a target position of the peripheral portion of the target object by a predetermined distance.

In accordance with still another aspect, there is provided a processing apparatus for processing a disc-shaped target object, including: a mounting table configured to mount thereon the target object; a focus ring provided to surround a periphery of the mounting table; and a position detection system, wherein the position detection system includes: a light source configured to generate measurement light; three or more optical elements configured to emit the measurement light generated by the light source as emission light and receive reflected light; a driving unit configured to move each of the optical elements such that a scanning range from the focus ring to the target object mounted on the mounting table is scanned; and a control unit configured to obtain positional relation between the focus ring and the target object mounted on the mounting table based on the reflected light in the scanning range of each of the optical elements.

In accordance with still another aspect, there is provided a processing apparatus for processing a disc-shaped target object having an inclined peripheral portion, including: a mounting table configured to mount thereon the target object; and a position detection system, wherein the position detection system includes: a light source configured to generate measurement light; three or more optical elements configured to emit the measurement light generated by the light source as emission light and receive reflected light; and a control unit configured to determine whether or not the target object is located at a target position on the mounting table based on the reflected light incident on each of the optical elements, wherein each of the optical elements is arranged such that the emission light is emitted to a target position of the peripheral portion of the target object.

In accordance with still another aspect, there is provided a processing apparatus for processing a disc-shaped target object having an inclined peripheral portion, including: a mounting table configured to mount thereon the target object; and a position detection system, wherein the position detection system includes: a light source configured to generate measurement light; three or more optical elements configured to emit the measurement light generated by the light source as emission light and receive reflected light; and a control unit configured to determine whether or not the target object is located at a target position on the mounting table based on the reflected light incident on each of the optical elements, wherein each of the optical elements is arranged such that the emission light is emitted to a position inwardly separated from a target position of the peripheral portion of the target object by a predetermined distance.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
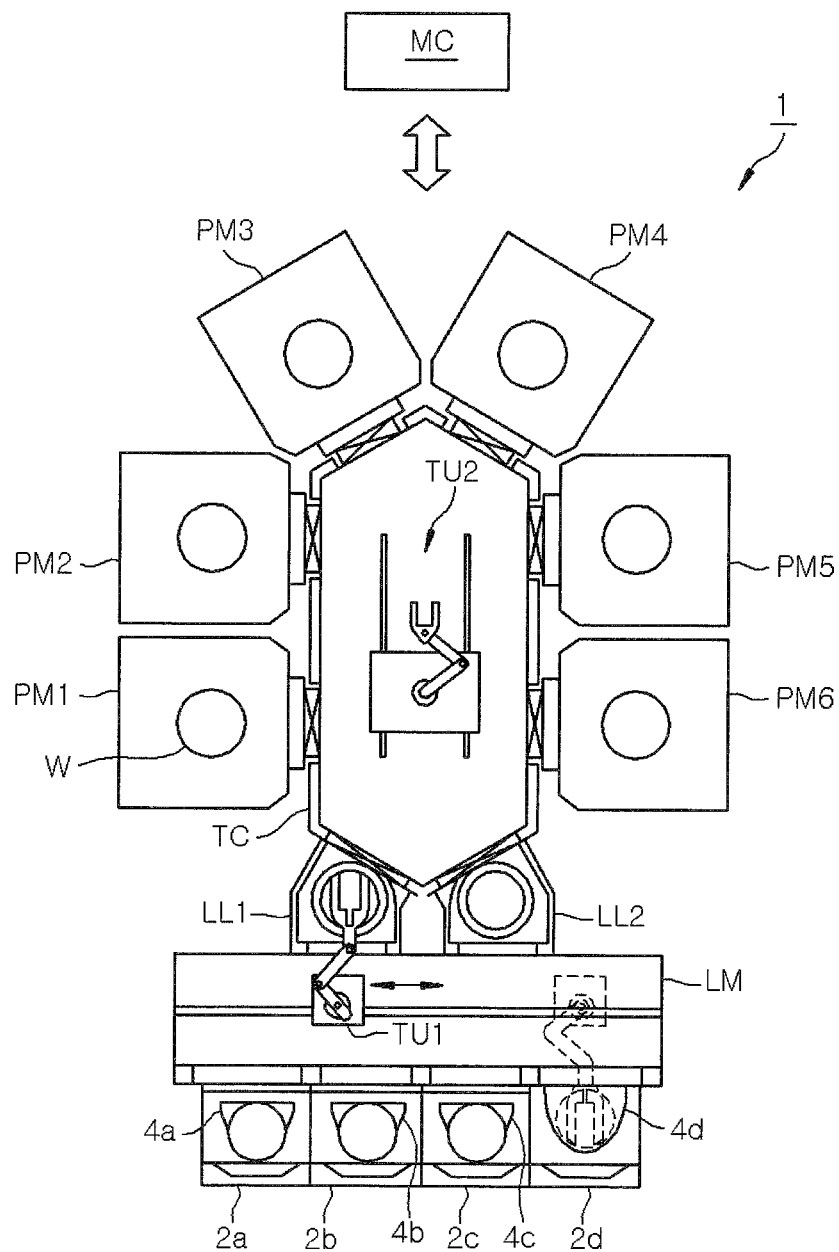
FIG. 1 shows an example of a processing system.

Hereinafter, embodiments will be described in detail with reference to the accompanying drawings. Like reference numerals will be used for like or corresponding parts throughout the drawings.

First Embodiment

FIG. 1 shows an example of a processing system. A processing system 1 shown in FIG. 1 includes a processing apparatus for processing a target object, a transfer unit for transferring the target object to the processing apparatus, and a position detection system capable of detecting positional relation between the target object in a processing chamber of the processing apparatus and a component of the processing apparatus. The target object is a disc-shaped object to be processed by the processing apparatus. For example, the target object is a wafer. The target object may have an inclined peripheral portion (bevel). The wafer may or may not have been processed or plasma-treated.

The processing system 1 includes stages 2a to 2d, containers 4a to 4d, a loader module LM, load-lock chambers LL1 and LL2, process modules PM1 to PM6, and a transfer chamber TC.

The stages 2a to 2d are arranged along one side of the loader module LM. The containers 4a to 4d are mounted on the tables 2a to 2d, respectively. The containers 4a to 4d are configured to accommodate wafers W.

The loader module LM has a chamber wall which defines a transfer space at an atmospheric pressure therein. The loader module LM has a transfer unit TU1 in the transfer space. The transfer unit TU1 is configured to transfer a wafer W between the containers 4a to 4d and the load-lock chambers LL1 and LL2.

Each of the load-lock chambers LL1 and LL2 is provided between the loader module LM and the transfer chamber TC. Each of the load-lock chambers LL1 and LL2 provides a preliminary decompression space.

The transfer chamber TC is connected to the load-lock chambers LL1 and LL2 via respective gate valves. The transfer chamber TC provides an evacuable decompression space and accommodates a transfer unit TU2 in the decompression space. The transfer unit TU2 is configured to transfer the wafer W between the load-lock chambers LL1 and LL2 and the process modules PM1 to PM6 and between any two process modules among the process modules PM1 to PM6.

The process modules PM1 to PM6 are connected to the transfer chamber TC via respective gate valves. The process modules PM1 to PM6 are processing apparatuses configured to perform single-purpose processing such as plasma processing on the wafer W.

The following is description on a series of operations for processing the wafer in the processing system 1. The transfer unit TU1 of the loader module LM unloads the wafer W from any one of the containers 4a to 4d and transfers the wafer W to one of the load-lock chambers LL1 and LL2. Next, one of the load-lock chambers reduces a pressure in the preliminary decompression space to a predetermined level. Then, the transfer unit TU2 of the transfer chamber TC unloads the wafer W from one of the load-lock chambers and transfers the wafer W to any one of the process modules PM1 to PM6. Thereafter, the wafer W is processed in one or more process modules among the process modules PM1 to PM6. Next, the transfer unit TU2 transfers the processed wafer from the process module to one of the load-lock chambers LL1 and LL2. Then, the transfer unit TU1 transfers the wafer W from one of the load-lock chambers to one of the vessels 4a to 4d.

The processing system 1 further includes a control unit MC. The control unit MC may be a computer having a processor, a storage unit such as a memory or the like, a display device, an input/output device, a communication device and the like. The above-described series of operations of the processing system 1 is performed by the control unit MC which controls the respective components of the processing system 1 based on a program stored in the storage device.

Figure 2:
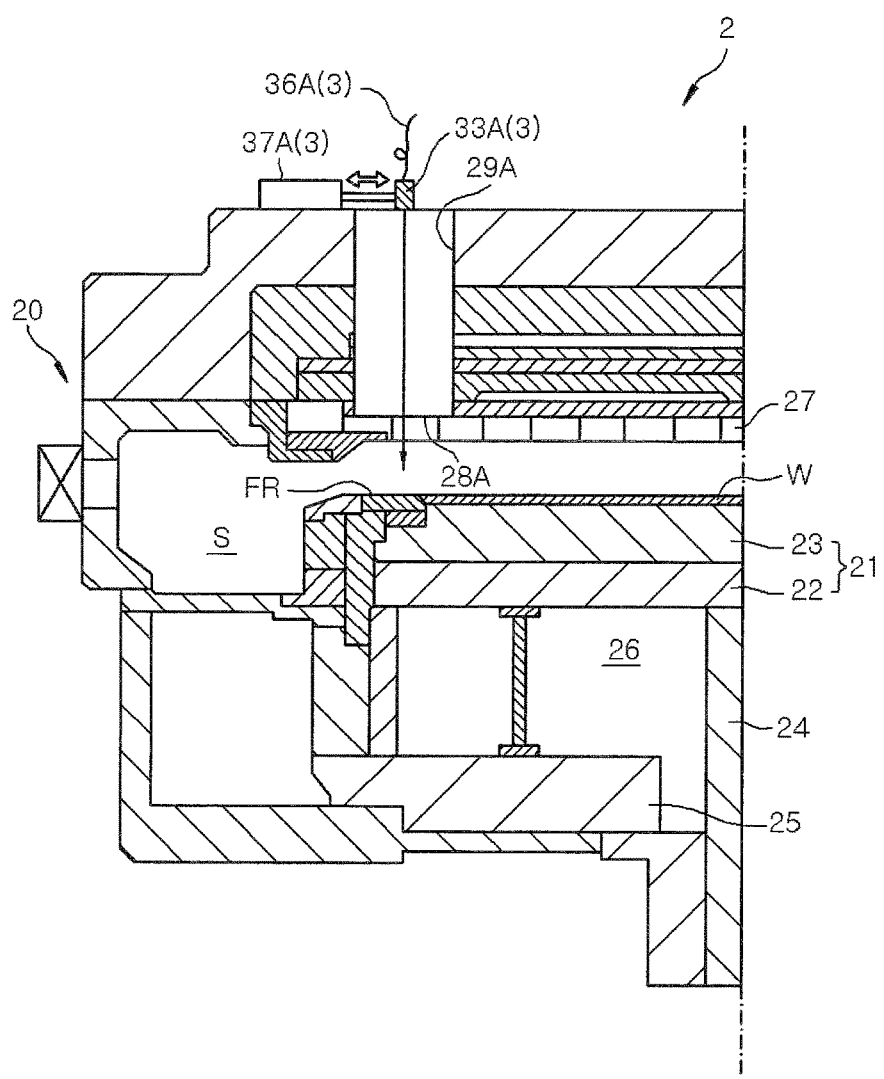
FIG. 2 schematically shows vertical cross sectional structures of principal parts of a processing apparatus according to an embodiment.

Next, the processing apparatus 2 that is an example of the process modules PM1 to PM6 will be described. FIG. 2 schematically shows vertical cross sectional structures of principal parts of the processing apparatus 2 according to an embodiment. As shown in FIG. 2, the processing apparatus 2 includes a processing chamber 20 for processing the wafer W accommodated therein by a plasma.

The processing chamber 20 has a processing space S therein. The processing space S can be evacuated to vacuum. In the processing space S, a mounting table 21 for mounting thereon a wafer W is provided. The mounting table 21 includes: an RF plate 22 made of a conductive material and to which a high frequency power is applied; and an electrostatic chuck mechanism 23 provided on the RF plate 22 and configured to attract and hold the wafer W. A central portion of the RF plate 22 is connected to a power feed rod 24 electrically connected to a high frequency power supply (not shown).

A focus ring FR is provided on the mounting table 21 to surround a periphery of the mounting table 21. The focus ring FR is an annular member. The focus ring FR is provided to improve in-plane uniformity of the plasma processing of the wafer W. The focus ring FR can be separated from the mounting table 21 and replaced with a new focus ring FR at the time of maintenance.

A base plate 25 is provided at a bottom portion of the processing chamber 20. A cavity 26 is formed between the RF plate 22 and the base plate 25. The cavity 26 has a height enough to insulate the RF plate 22 and the base plate 25. A driving unit (not shown) for pusher pins (not shown) is provided in the cavity 26. The pusher pins receive the wafer W from a transfer arm such as the transfer unit TU2 and mount the wafer W on the mounting table 21. Further, the pusher pins lift the wafer W from the mounting table 21 and deliver the wafer W to the transfer arm. The cavity 26 is in an atmospheric atmosphere, not in a vacuum atmosphere.

A facing electrode 27 (example of upper electrode) is provided above the mounting table 21 to face the mounting table 21 with a gap therebetween. The facing electrode 27 is a so-called shower head and configured to supply a predetermined processing gas in a shower pattern to the wafer W mounted on the mounting table 21. The facing electrode 27 is set to a ground potential. Or, a high frequency power is applied to the facing electrode 27.

A first window 28A is formed on the facing electrode 27. The first window 28A is extended from the top toward the bottom of the processing chamber 20. The first window 28A has a light transmitting structure which is airtightly sealed. The processing chamber 20 has a first through-hole 29A corresponding to the first window 28A. The first window 28A and the first through-hole 29A constitute a first light introducing path for irradiating measurement light to the processing space S.

A first focuser 33A (example of optical element), one of the components of a position detection system 3 which will be described later, is provided at an upper end of the first through-hole 29A. The first focuser 33A is connected to a light source through a first optical fiber 36A and irradiates the measurement light to the processing space S through the first through-hole 29A and the first window 28A. The first focuser 33A is connected to a first actuator 37A (example of driving unit) for moving the first focuser 33A to perform scanning in a horizontal direction. The first actuator 37A is an electrically controllable driving mechanism. For example, the first actuator 37A is a stepping motor or the like.

In the processing chamber 20, a plurality of light introducing paths identical to the first light introducing path is provided along the circumferential direction of the mounting table 21 and the focus ring FR. Specifically, a second window 28B and a second through-hole 29B (both not shown) constituting a second light introducing path and a third window 28C and a third through-hole 29C (both not shown) constituting a third light introducing path are provided along the circumferential direction of the mounting table 21 and the focus ring FR. A second focuser 33B (example of optical element) and a third focuser 33C (example of optical element) are provided in the second light introducing path and the third light introducing path, respectively. Accordingly, at least three sets of the window, the through-hole and the focuser are formed at the upper side of the facing electrode 27.

Figure 3:
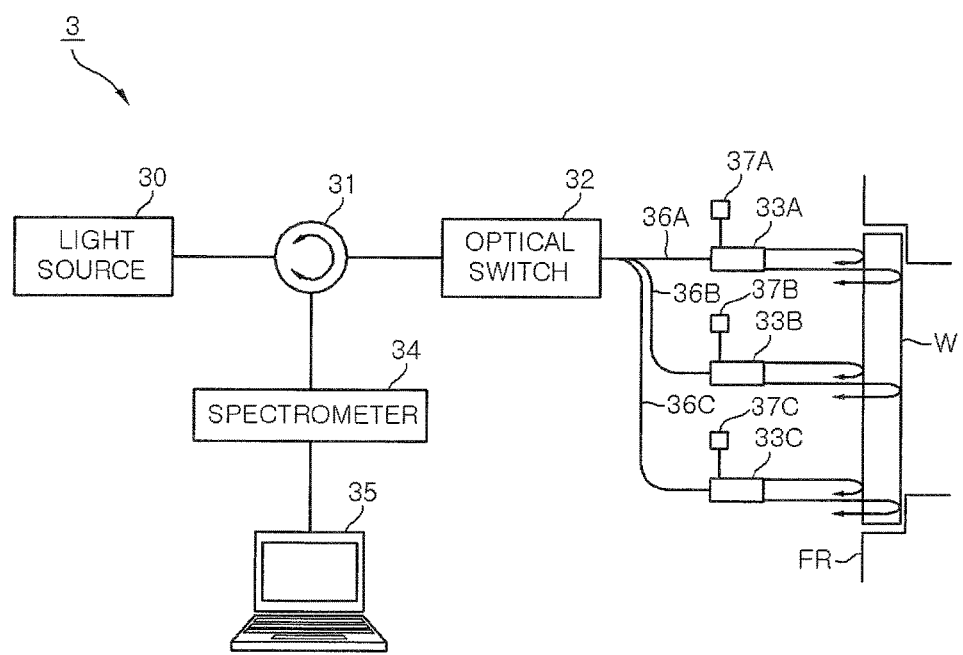
FIG. 3 shows an example of a position detection system according to an embodiment.

Next, a configuration of the position detection system of the processing apparatus 2 will be described. FIG. 3 shows an example of a position detection system 3 according to an embodiment. The position detection system 3 detects positional relation between the wafer W and the components of the processing apparatus 2 by measuring a distance from the focuser to a reflection position by using interference of a reflected light and scanning the focuser. As shown in FIG. 3, the position detection system 3 includes a light source 30, an optical circulator 31, an optical switch 32, the first focuser 33A, the second focuser 33B, the third focuser 33C and a spectrometer 34. The spectrometer 34 is connected to an operation unit 35 (example of control unit). The operation unit 35 may be a computer having a processor, a storage unit such as a memory or the like, a display device, an input/output device, a communication device and the like. A series of operations of the position detection system 3 which will be described later is performed by the operation unit 35 which controls the respective components of the position detection system 3 based on the program stored in the storage unit. The operation unit 35 may be integrated with the control unit MC shown in FIG. 1. The light source 30, the optical circulator 31, the optical switch 32, the first focuser 33A, the second focuser 33B, the third focuser 33C and the spectrometer 34 are connected by using optical fibers.

The light source 30 generates measurement light having a wavelength which transmits a measurement target. An SLD (Super Luminescent Diode) is used as an example of the light source 30. The measurement target is formed in, e.g., a plate shape, and has a top surface and a rear surface opposite to the top surface. An object to be measured (wafer W) and a component of the processing apparatus 2 such as the focus ring FR, the facing electrode 27 or the like are made of, e.g., Si (silicon), $SiO_2$ (quartz), $Al_2O_3$ (sappier) or the like. A refractive index of Si is, e.g., 3.4 at a wavelength of 4 µm. A refractive ratio of $SiO_2$ is, e.g., 1.5 at a wavelength of 1 µm. A refractive ratio of $Al_2O_3$ is, e.g., 1.8 at a wavelength of 1 µm. These refractive ratios are changed by doping impurities. For example, a refractive ratio of Si doped with impurities is about 3.6 at a wavelength of 1560 nm.

The optical circulator 31 is connected to the light source 30, the optical switch 32 and the spectrometer 34. The optical circulator 31 irradiates the measurement light generated by the light source 30 to the optical switch 32. The optical switch 32 has one input terminal and three output terminals. The input terminal is connected to the optical circulator 31. The three output terminals are connected to the first to the third focuser 33A to 33C through a first to a third optical fiber 36A to 36C, respectively. The optical switch 32 is configured to switch an output destination. The light from the optical circulator 31 is inputted into the input terminal of the optical switch 32 and outputted from the three output terminals of the optical switch 32 alternately.

The first to the third focuser 33A to 33C emit, as emission light, the measurement light generated by the light source 30, and reflected light enter the first to the third focuser 33A to 33C. Specifically, the first to the third focuser 33A to 33C emit the measurement light as the emission light to the top surface of the wafer W. The first to the third focuser 33A to 33C emit the measurement light controlled as parallel beam to the wafer W. The reflected light from the wafer W enter the first to the third focuser 33A to 33C. The reflected light includes light reflected on the top surface of the wafer W and light reflected on the backside of the wafer W. The first to the third focuser 33A to 33C emit the reflected light to the optical switch 32.

Figure 4:
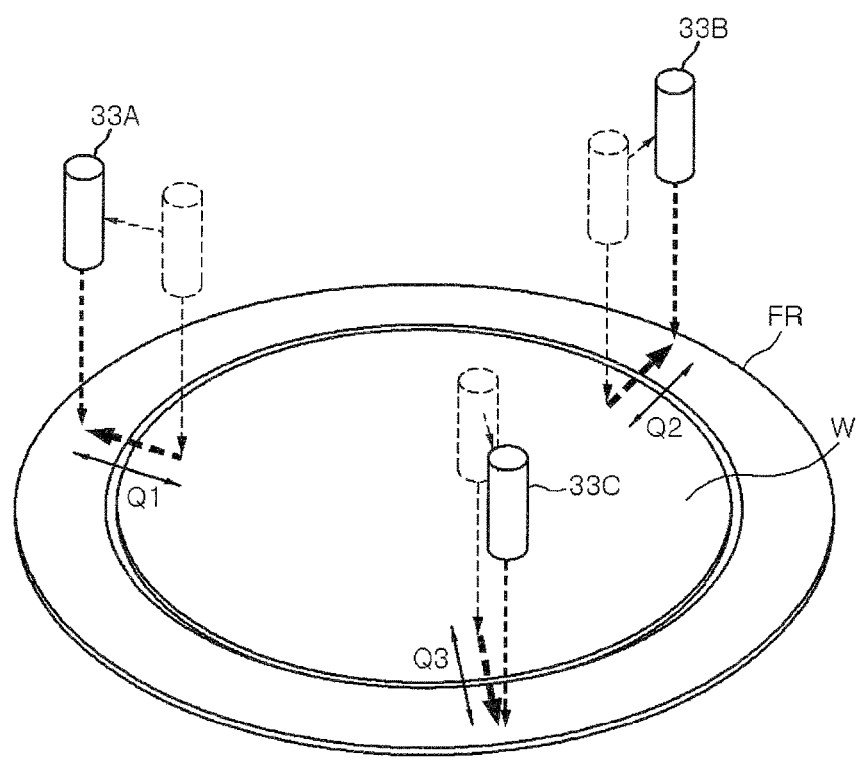
FIG. 4 schematically shows an example of scanning using three focusers.

The first actuator 37A, a second actuator 37B (example of driving unit), and a third actuator 37C (example of driving unit) are driven by the operation unit 35. The first to the third actuator 37A to 37C move the first to the third focuser 33A to 33C to scan a predetermined scanning range. The first to the third focuser 33A to 33C can scan the predetermined scanning range by the first to the third actuator 37A to 37C, respectively. The scanning range extends from the focus ring FR to the wafer W. For example, the scanning range corresponds to a width of the first through-hole 29A and the first window 28A shown in FIG. 2. FIG. 4 schematically shows an example of scanning using three focusers. As shown in FIG. 4, the first focuser 33A scans a first scanning range Q1 extending in a diametrical direction. The second focuser 33B scans a second scanning range Q2 extending in the diametrical direction while being separated from the first scanning range Q1 in a circumferential direction. The third focuser 33C scans a third scanning range Q3 extending in the diametrical direction while being separated from the first and the second scanning range Q1 and Q2 in the circumferential direction. The scanning direction may be a diametrically outward direction or a diametrically inward direction.

Referring back to FIG. 3, the optical switch 32 emits the reflected light from the first to the third focuser 33A to 33C to the optical circulator 31 alternately. The optical circulator 31 emits the reflected light to the spectrometer 34. The spectrometer 34 measures spectrum (interference intensity distribution) of the reflected light from the optical circulator 31. The reflected light spectrum shows intensity distribution that depends on a frequency or a wavelength of the reflected light. The spectrometer 34 outputs the reflected light spectrum to the operation unit 35.

Figure 5:
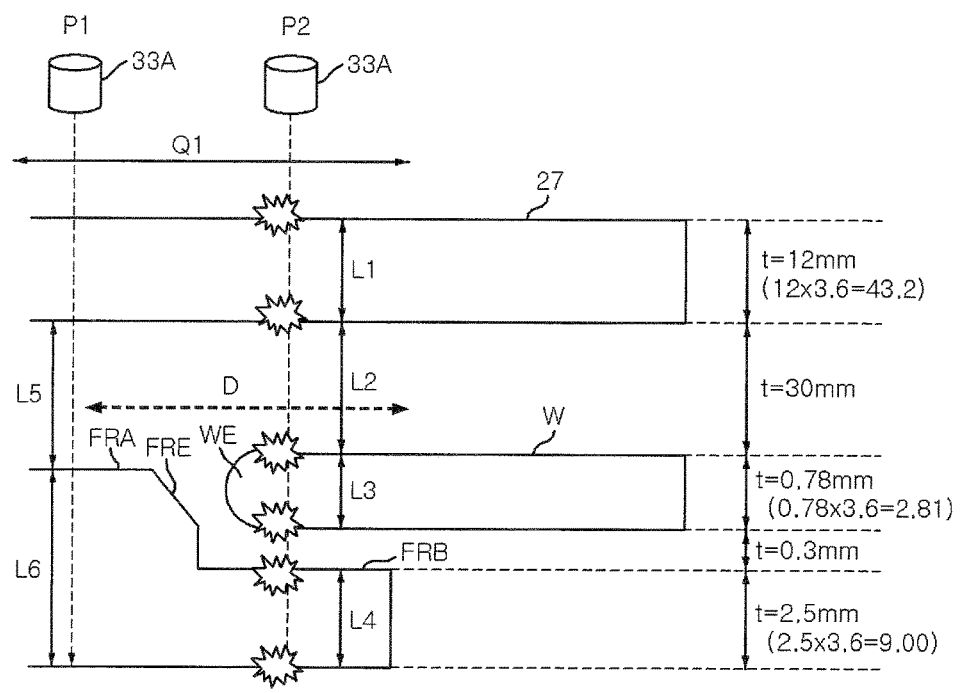
FIG. 5 explains a measurement position of the position detection system.

The operation unit 35 calculates positional relation between the focus ring FR and the wafer W mounted on the mounting table 21 based on the reflected light in the scanning range of each of the focusers. FIG. 5 explains a measurement location of the position detection system 3 according to an embodiment. As shown in FIG. 5, the first focuser 33A will be described as an example. The first focuser 33A moves within the first scanning range Q1 extending from the focus ring FR to the wafer W while outputting the emission light.

The emission light outputted from the first focuser 33A is reflected by the respective components of the processing apparatus 2 or the wafer W. For example, the emission light is reflected on the top surface and the rear surface of the facing electrode 27, the top surface and the backside of the wafer W, and the top surface and the rear surface of the focus ring FR. The position detection system can obtain the interference spectrum formed by interference of the reflected light at each scanning position.

Figure 6:
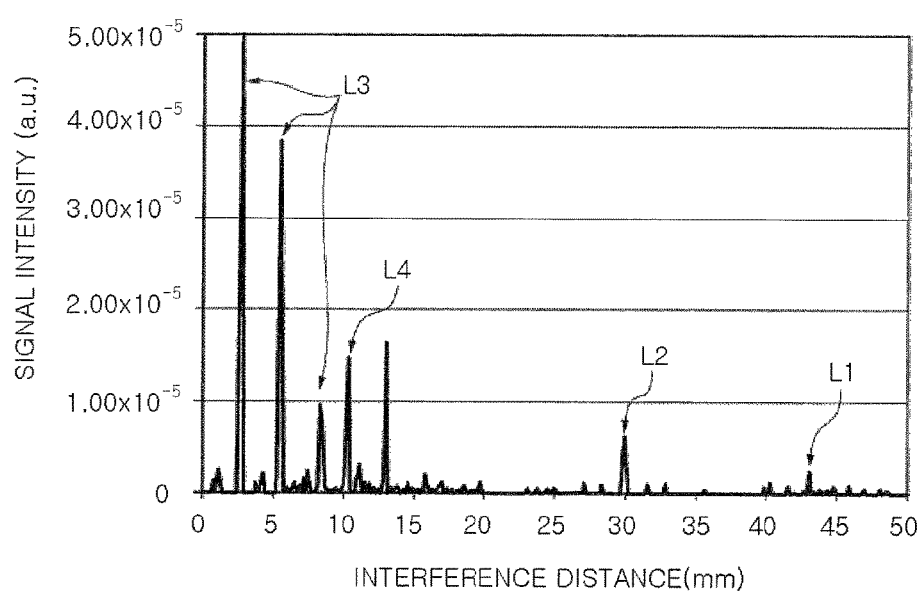
FIG. 6 shows an example of an interference spectrum corresponding to a scanning position of FIG. 5.

FIG. 6 shows an example of the interference spectrum corresponding to a scanning position P2 of FIG. 5. The interference spectrum shown in FIG. 6 is obtained by irradiating measurement light having a wavelength of 1560 nm and a spot diameter of 0.1 mm from the first focuser 33A. In FIG. 6, the horizontal axis represents an interference distance [mm], and the vertical axis represents a signal intensity [a.u]. The facing electrode 27, the focus ring FR and the wafer W are made of silicon doped with impurities. A peak of the interference distance L1 occurs by the interference of the reflected light from the top surface and the rear surface of the facing electrode 27. A peak of the interference distance L2 occurs by the interference of the reflected light from the rear surface of the facing electrode 27 and the top surface of the wafer W. A peak of the interference distance L3 occurs by the interference of the reflected light from the top surface and the backside of the wafer W. A peak of the interference distance L4 occurs by the interference of the reflected light from the top surface and the rear surface of the focus ring FR (lower portion FRB of a two-step portion of the focus ring FR).

Based on the interference distance at which the peak occurs and the refractive index of the material forming the measurement target such as the facing electrode 27, the focus ring FR, the wafer W or the like, the operation unit calculates a thickness of the measurement target or a distance of a light irradiation direction. The interference distance is obtained by multiplying the refractive index by an actual thickness or distance. For example, the operation unit 35 obtains a thickness (12 mm) of the facing electrode 27 by dividing the interference distance L1 (43.2 mm) by the refractive index (3.6) of silicon doped with impurities which is the material forming the facing electrode 27. The operation unit 35 obtains a gap distance (30 mm) between the rear surface of the facing electrode 27 and the top surface of the wafer W by dividing the interference distance L2 (30 mm) by the refractive index (1) of vacuum. The operation unit 35 obtains a thickness (0.78 mm) of the wafer W by dividing the interference distance L3 (2.81 mm) by the refractive index (3.6) of silicon doped with impurities which is the material forming the wafer W. The operation unit 35 obtains a thickness (2.5 mm) of the lower portion FRB of the focus ring FR by dividing the interference distance L4 (9.00 mm) by the refractive index (3.6) of silicon doped with impurities which is the material forming the focus ring FR.

The operation unit 35 performs the operation performed at the scanning position P2 also at the scanning position P1 by using the interference spectrum obtained at the scanning position P1. In other words, the operation unit 35 performs the above-described operation at the respective scanning positions based on the interference spectrum obtained at the respective scanning positions within the first scanning range Q1. The operation unit 35 can also calculate variation in a horizontal direction of the thickness and the distance by plotting the information on the thickness and the distance calculated in the first scanning range Q1 in a scanning direction. Further, the operation unit 35 can obtain the positional relation between the focus ring FR and the wafer W. The positional relation is, e.g., a horizontal distance D between the focus ring FR and the wafer W, a displacement amount between the central positions thereof, a difference in surface heights therebetween or the like.

Figure 7:
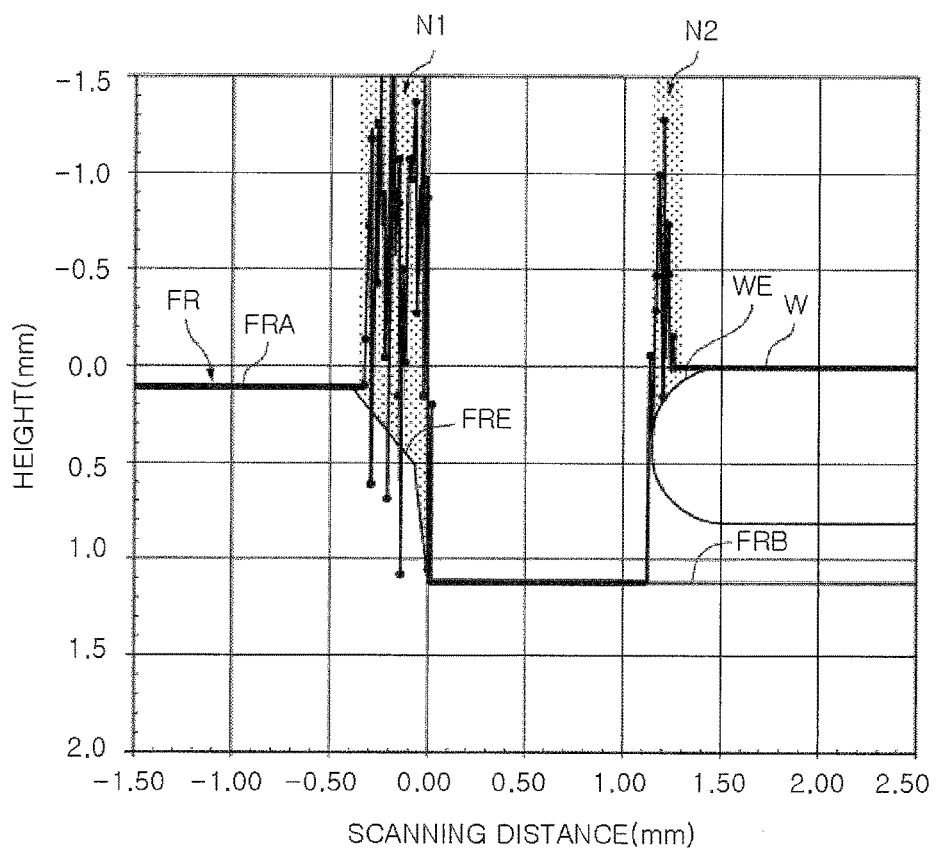
FIG. 7 shows height information in a scanning region which is calculated based on the interference spectrum of FIG. 6.

FIG. 7 shows height information in a scanning region which is obtained based on the interference spectrum of FIG. 6. In FIG. 7, the horizontal axis represents a scanning distance [mm] that is a relative value with respect to a reference value (0 mm) set, for convenience, to a boundary between an inclined surface FRE and the lower portion FRB of the focus ring FR. The vertical axis represents a height

[mm] that is a relative value with respect to a reference value (0 mm) set, for convenience, to a height of the top surface of the wafer W. The height calculated by the operation unit 35 is indicated by thick solid lines. In FIG. 7, the positions of the components of the processing apparatus 2 are indicated by thin solid lines to correspond to the measurement result. As can be seen from FIG. 7, noise N1 and noise N2 are generated at the inclined surface FRE of the focus ring FR and at a peripheral portion WE of the wafer W, respectively. However, a surface height of a flat portion of the wafer W and surface heights of flat portions of the focus ring FR (upper portion FRA and lower portion FRB) were accurately obtained.

Figure 8:
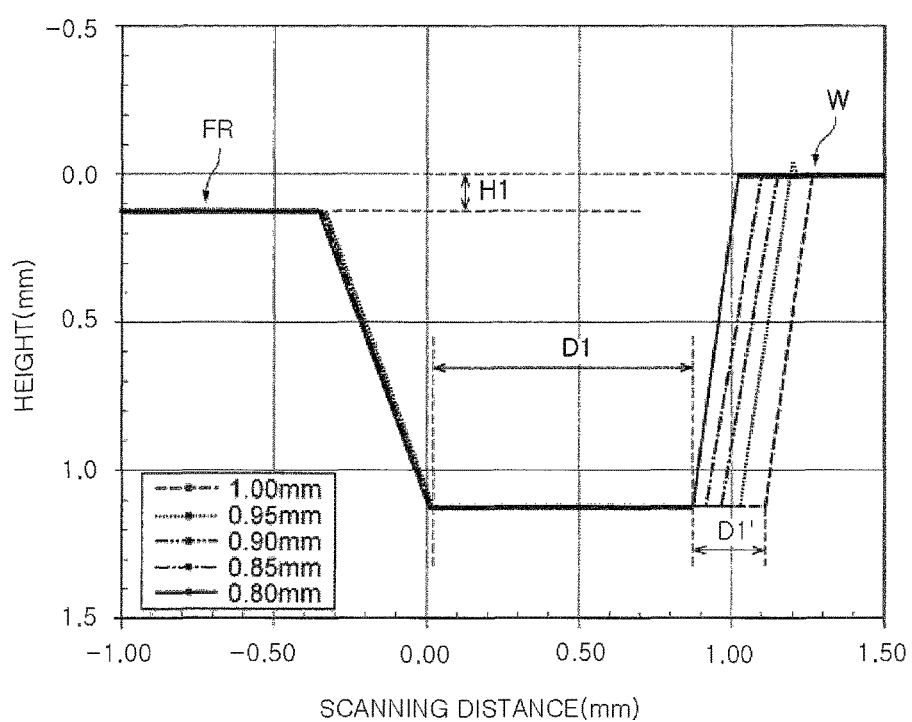
FIG. 8 shows an example of positional relation between a focus ring and a wafer.

The operation unit 35 extracts height information on the flat portion of the wafer W and height information on the flat portions (upper portion FRA and lower portion FRB) of the focus ring FR from the height information in the scanning range and then performs linear interpolation. The operation unit 35 obtains the positional relation between the focus ring FR and the wafer W by obtaining the height information from which the noises N1 and N2 are removed. FIG. 8 shows an example of the positional relation between the focus ring FR and the wafer W which is the result obtained based on the height information of FIG. 7. As can be seen from FIG. 8, a distance D1 in the horizontal direction between the focus ring FR and the wafer W and a height difference H1 between the focus ring FR and the wafer W are obtained. The measurement was performed by using a micrometer while moving the wafer W at a pitch of 0.05 mm, and results thereof were plotted. From D1' of FIG. 8, it has been confirmed that the difference of 0.05 mm can be obtained by the position detection system 3.

Further, the operation unit 35 determines whether or not the wafer W is located at a target position on the mounting table 21 based on the positional relation obtained in each of the focusers. The target position of the wafer W is, e.g., the central position of the mounting table 21. In that case, the operation unit 35 determines whether or not the central position of the wafer W coincides with the central position of the mounting table 21.

The operation unit 35 measures the horizontal distance D between the focus ring FR and the wafer W at three or more locations in the circumferential direction. The operation unit 35 calculates a displacement amount (distance between centers and displacement direction) between the central position of the focus ring FR and the central position of the wafer W based on the positional relation of the three locations. Since the positional relation between the focus ring FR and the mounting table 21 is fixed, the operation unit 35 calculates a displacement amount between the central position of the mounting table 21 and the central position of the wafer W based on the positional relation between the focus ring FR and the mounting table 21 and the displacement amount between the central position of the focus ring FR and the central position of the wafer W. For example, when the central position of the focus ring FR coincides with the central position of the mounting table 21, the displacement amount between the central position of the focus ring FR and the central position of the wafer W becomes the displacement amount between the central position of the mounting table 21 and the central position of the wafer W. The operation unit determines whether or not the central position of the wafer W coincides with the central position of the mounting table 21 based on the calculated displacement amount.

If the displacement amount between the central positions is detected, the operation unit 35 may output the displacement amount between the central positions to the control unit MC. In that case, the control unit MC can control a teaching value (control parameter for controlling the operation of the transfer unit TU2) of the transfer unit TU2 such that the displacement amount between the central positions becomes zero.

Figure 9:
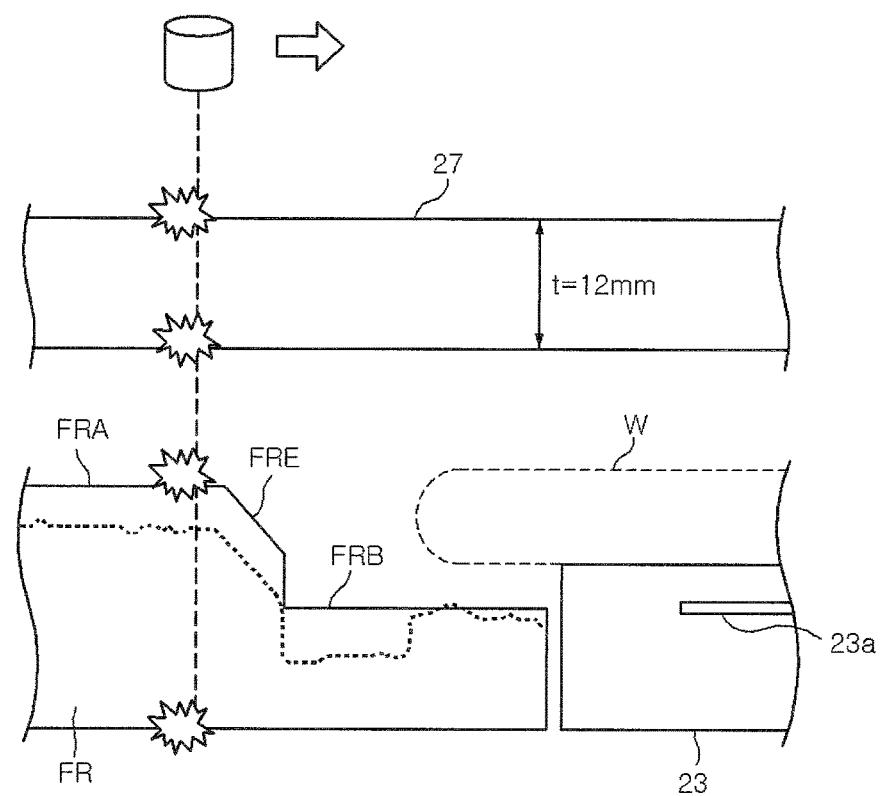
FIG. 9 explains detection of wear of components of the processing apparatus.

Further, the operation unit 35 may detect wear of the components of the processing apparatus 2. The components of the processing apparatus 2 include any component in the scanning range. For example, the components are the focus ring FR, the facing electrode 27, the electrostatic chuck mechanism 23 and the like. FIG. 9 explains detection of wear of the components of the processing apparatus 2. In FIG. 9, the wear of the top surface of the focus ring FR is detected. The top surface of the focus ring FR is exposed to the plasma and worn gradually. The worn focus ring FR is replaced with a new focus ring FR at the time of maintenance. In FIG. 9, a top surface of the new focus ring FR immediately after the maintenance is indicated by a solid line and a top surface of the focus ring FR that has been used a predetermined number of times is indicated by a dotted line.

The operation unit 35 calculates displacement in the horizontal direction of the heights of the components within the scanning range. In the case of replacing the focus ring FR during the maintenance, the operation unit 35 calculates the displacement in the horizontal direction of the top surface of the new focus ring FR before the plasma processing is started, and then stores the calculated result as reference height information in the storage unit. The operation unit 35 calculates the displacement in the horizontal direction of the height of the top surface of the focus ring FR after a predetermined number of wafers W have been processed. The operation unit 35 compares the calculated displacement (height information) in the horizontal direction of the height of the top surface of the focus ring FR with the reference height information stored in the storage unit. Specifically, the operation unit 35 calculates a difference between the calculated height information and the reference height information.

Figure 10:
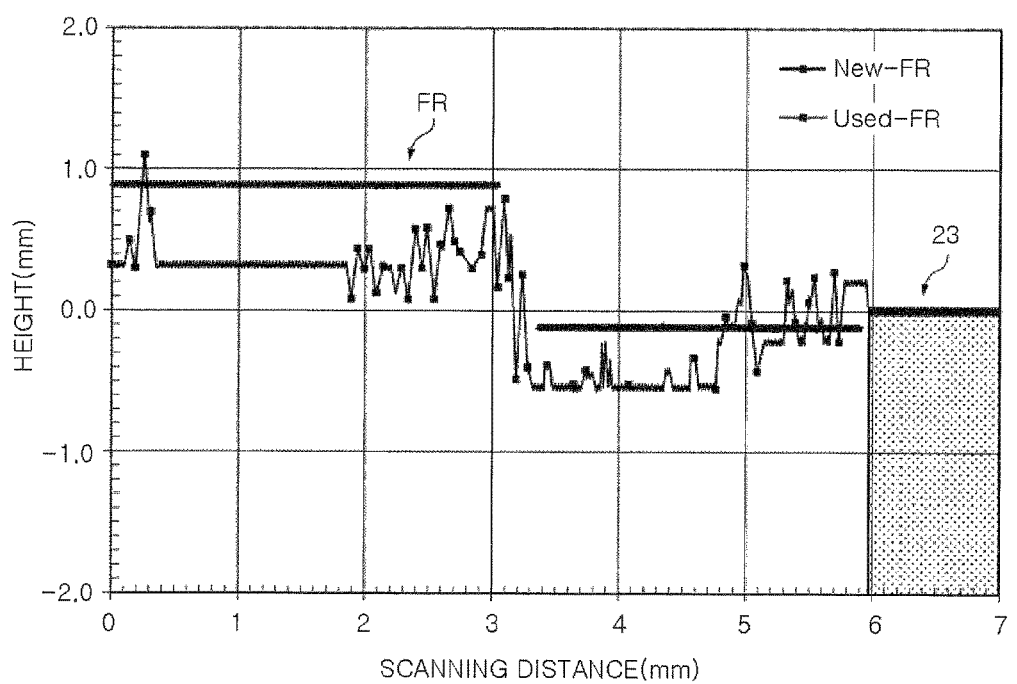
FIG. 10 shows examples of a height of a top surface of a new focus ring and a height of a top surface of a used focus ring.

FIG. 10 shows examples of a height of a top surface of a new focus ring FR and a height of a top surface of a used focus ring FR. In FIG. 10, the horizontal axis represents a scanning distance [mm] and the vertical axis represents a height [mm] that is a relative value with respect to a reference value (0 mm) set, for convenience, to a height of the top surface of the wafer W. The height of the top surface of the new focus ring FR is indicated by a thick solid line and the height of the top surface of the used focus ring FR is indicated by a thin solid line. As can be seen from FIG. 10, the height of the top surface of the new focus ring FR is constant in the horizontal direction, which indicates the top surface of the new focus ring FR is flat. On the other hand, the height of the top surface of the used focus ring FR is not constant in the horizontal direction, which indicates that the top surface of the used focus ring FR is not flat. The operation unit 35 calculates the height (representative value, average value or the like) of the top surface of the used focus ring FR in a state where the noise is removed. The operation unit 35 calculates a difference (about 0.5 mm) between the calculated height information and the reference height information. The calculated difference that is a wear rate can be used in determining timing of replacing the focus ring FR. For example, the operation unit 35 compares the difference (0.5 mm) with a predetermined threshold and determines that the focus ring FR needs to be replaced when the difference is greater than the predetermined threshold.

The operation unit 35 can detect wear of other components in the same manner as that in the above-described process of detecting wear of the focus ring FR. For example, in the case of detecting wear of the facing electrode 27 or the electrostatic chuck mechanism 23, the operation unit 35 may set a scanning range such that the facing electrode 27 or the electrostatic chuck mechanism 23 is within the scanning range and obtain a reference height position of the facing electrode 27 or the electrostatic chuck mechanism 23 in advance. Since the electrostatic chuck mechanism 23 has therein the electrode 23a, a wear rate of an insulating layer from the top surface of the electrostatic chuck mechanism 23 to the electrode 23a can be obtained.

In accordance with the processing apparatus 2 (example of position detection system 3) according to the first embodiment, variation of the thicknesses of the wafer W, the focus ring FR and the facing electrode 27 in the first to the third scanning range Q1 to Q3 can be detected by scanning the first to the third focuser 33A to 33C (examples of three or more optical elements). The distance D1 between the wafer W and the focus ring FR and the height difference H1 in the first to the third scanning range Q1 to Q3 are calculated by using the variation of the thicknesses. Since the wafer W has a disc shape, the position detection system can obtain the displacement amount between the central position of the wafer W and the central position of the focus ring FR by moving at least three focusers.

In accordance with the processing apparatus 2 (example of position detection system 3) according to the first embodiment, it is possible to obtain wear rates of the components of the processing apparatus 2, such as the focus ring FR, the facing electrode 27, the electrostatic chuck mechanism 23 and the like.

Second Embodiment

A position detection system according to a second embodiment is the same as the position detection system 3 according to the first embodiment except that the first to the third actuator 37A to 37C are not provided and that the determination contents of the operation unit 35 is different. Hereinafter, differences will be mainly described and redundant description will be omitted.

Figure 11:
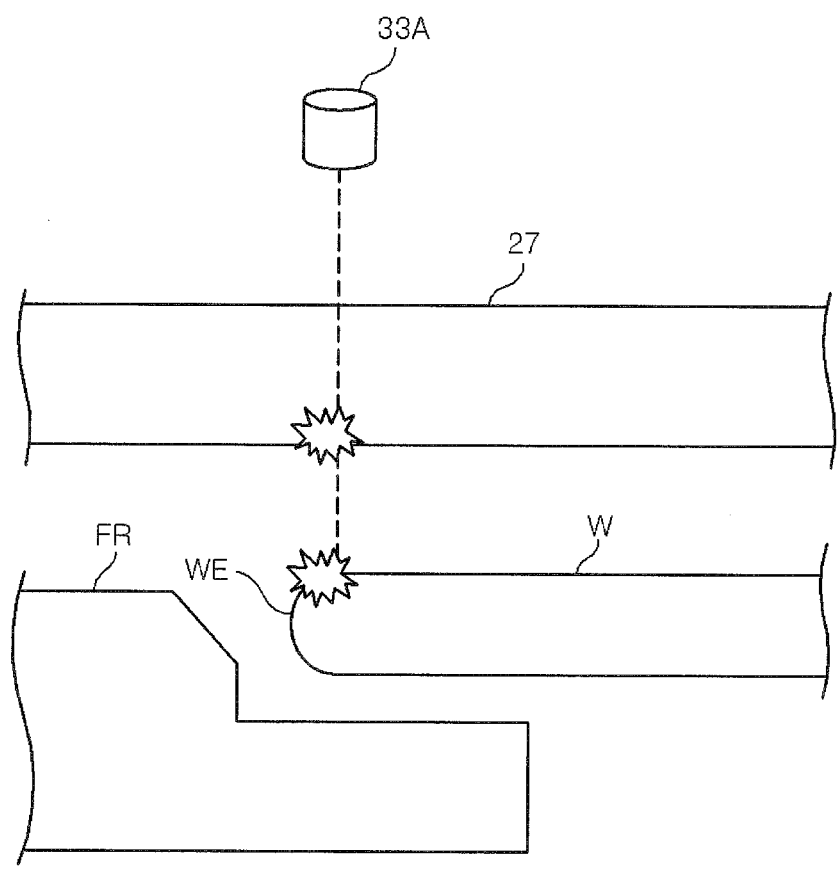
FIGS. 11 and 12 explain examples of an irradiation position of a focuser.

The first to the third focuser 33A to 33C of the position detection system according to the second embodiment are not driven by actuators and arranged at predetermined positions. For example, when the wafer W is located at a target position on the mounting table 21, the first to the third focusers 33A to 33C are arranged such that emission light is emitted to a position (example of target position of peripheral portion WE) of the peripheral portion WE of the wafer W. When the target position of the wafer W is the central position on the mounting table 21, the target position of the peripheral portion WE is separated from the central position of the mounting table 21 by a distance corresponding to a radius of the wafer W. FIG. 11 explains an example of an irradiation position of a focuser. As shown in FIG. 11, the first focuser 33A is arranged such that the emission light is irradiated to the peripheral portion WE of the wafer W when the wafer W is located at the target position on the mounting table 21. The second and the third focuser 33B and 33C are also arranged such that the emission light is irradiated to the peripheral portion WE of the wafer W when the wafer W is located at the target position on the mounting table 21. The first to the third focuser 33A to 33C are arranged along the circumferential direction of the mounting table 21. The first to the third focuser 33A to 33C are arranged such that the irradiation positions thereof are separated from one another.

The operation unit 35 determines whether or not the wafer W is located at the target position on the mounting table 21 based on the reflected light incident on the focusers. Here, the target position of the wafer W is the central position of the mounting table 21. When the emission light from the focuser is irradiated to the wafer W, interference occurs by the reflected light from the top surface and the backside of the wafer W. However, when the emission light from the focuser is irradiated to the inclined peripheral portion WE, the emission light is reflected in a direction in accordance with the inclination of the peripheral portion WE. Accordingly, there is no interference caused by the reflected light from the top surface and the backside of the wafer W. The operation unit 35 determines whether or not the wafer W is located at the target position on the mounting table 21 by using such characteristics.

The operation unit 35 obtains the interference spectra of the first to the third focuser 33A to 33C. Further, the operation unit 35 determines that the wafer W is located at the target position on the mounting table 21 when the interference caused by the reflection from the wafer W is not detected in the interference spectra of the first to the third focuser 33A to 33C. On the other hand, the operation unit 35 determines that the wafer W is not located at the target position on the mounting table 21 when the interference caused by the reflection from the wafer W is detected in the interference spectra of any one of the first to the third focuser 33A to 33C.

In accordance with the processing apparatus (example of position detection system) according to the second embodiment, it is possible to determine whether or not the target object is located at the target position on the mounting table based on the reflected light incident on the respective focusers. Since the target object has a disc shape, the position detection system can determine whether or not the target object is located at the target position by determining at least three locations at the peripheral portion of the target object.

Third Embodiment

A position detection system according to a third embodiment is the same as the position detection system according to the second embodiment except that the arrangement positions of the first to the third focuser 33A to 33C are different. Hereinafter, differences will be mainly described and redundant description will be omitted.

Figure 12:
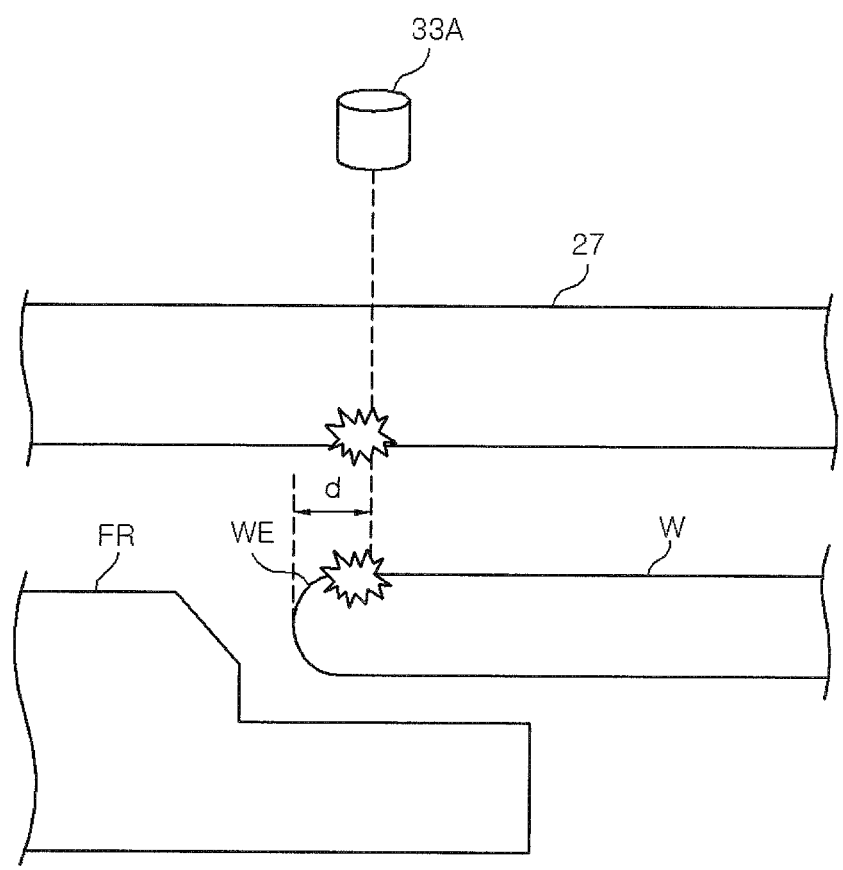

The first to the third focuser 33A to 33C of the position detection system according to the third embodiment are not driven by the actuator and arranged at respective predetermined positions, as in the second embodiment. For example, the first to the third focuser 33A to 33C are arranged such that the emission light is irradiated to a location inwardly separated from the target position of the peripheral portion WE by a predetermined distance. When the target position of the wafer W is the central position on the mounting table 21, the target position of the peripheral portion WE is separated from the central position of the mounting table 21 by a distance corresponding to a radius of the wafer W. FIG. 12 explains an example of an irradiation position of a focuser. As shown in FIG. 12, the first focuser 33A is arranged such that the emission light is irradiated to the location inwardly separated from the peripheral portion WE of the wafer W by a predetermined distance d when the wafer W is mounted at the target position on the mounting table 21. The second and the third focuser 33B and 33C are also arranged such that the emission light is irradiated to the location inwardly separated from the peripheral portion WE of the wafer W by the predetermined distance d when the wafer W is mounted at the target position on the mounting table 21. The first to the third focuser 33A to 33C are arranged along the circumferential direction of the mounting table 21. The first to the third focuser 33A and 33C are arranged such that the irradiation positions thereof are separated from one another. The predetermined distance d is, e.g., 0.01 mm to 0.60 mm.

The operation unit 35 determines whether or not the wafer W is located at the target position on the mounting table 21 based on the reflected light incident on the focusers. Here, the target position of the wafer W is the central position of the mounting table 21. When the emission light from the focuser is irradiated to the wafer W, the interference occurs by the reflected light from the top surface and the backside of the wafer W. However, when the emission light from the focuser is irradiated to the inclined peripheral portion WE, the emission light is reflected in a direction in accordance with the inclination of the peripheral portion WE. Accordingly, there is no interference caused by the reflected light from the top surface and the backside of the wafer W. The operation unit 35 determines whether or not the wafer W is located at the target position on the mounting table 21 by using such characteristics.

The operation unit 35 obtains the interference spectra of the first to the third focuser 33A to 33C. Further, the operation unit 35 determines that the wafer W is located at the target position on the mounting table 21 when the interference caused by the reflection light from the wafer W is detected in the interference spectra of the first to the third focuser 33A to 33C. On the other hand, the operation unit 35 determines that the wafer W is not located at the target position on the mounting table 21 when the interference caused by the reflected light from the wafer W is not detected in the interference spectra of the first to the third focuser 33A to 33C.

In accordance with the processing apparatus (example of position detection system) according to the third embodiment, it is possible to determine whether or not the target object is located at the target position on the mounting table based on the reflected light incident on the focusers. Since the target object has a disc shape, the position detection system can determine whether or not the target position is located at the target position by determining at least three locations at the peripheral portion of the target object.

The above-described embodiments may be variously modified or changed by those skilled in the art. For example, the optical element is not limited to the focuser. The optical element may be a collimator or the like as long as it has a function of irradiating light to the target object and receiving reflected light from the target object.

While the disclosure has been shown and described with respect to the embodiments, it will be understood by those skilled in the art that various changes and modifications may be made without departing from the scope of the disclosure as defined in the following claims.

What is claimed is:

1. A position detection system for use in a processing apparatus including a mounting table configured to mount thereon a disc-shaped target object and a focus ring surrounding a periphery of the mounting table, the position detection system comprising:
a light source configured to generate measurement light;
three or more optical elements configured to emit the measurement light generated by the light source as emission light and receive reflected light,
wherein the three or more optical elements are located at three or more different circumferential positions with respect to the target object to provide three or more optical paths at the three or more different circumferential positions;
a driving unit configured to move each of the optical elements to scan a scanning range from the focus ring to the target object mounted on the mounting table, the scanning range extending in a diametrical direction of the target object; and
a control unit configured to obtain positional relation between the focus ring and the target object mounted on the mounting table based on the reflected light in the scanning range of each of the optical elements.

2. The position detection system of claim 1, wherein the control unit determines whether or not the target object is located at a target position on the mounting table based on the positional relation obtained in each of the optical elements.

3. The position detection system of claim 1, wherein the control unit calculates a difference between height information of the focus ring which is obtained based on the reflected light in the scanning range and reference height information of the focus ring which is obtained in advance.

4. The position detection system of claim 1, wherein the processing apparatus includes an upper electrode above the focus ring,
the driving unit moves the respective optical elements such that the upper electrode is included in the scanning range, and
the control unit calculates a difference between height information of the upper electrode which is obtained based on the reflected light in the scanning range and reference height information of the upper electrode which is obtained in advance.

5. A position detection system for use in a processing apparatus including a mounting table configured to mount thereon a disc-shaped target object having an inclined peripheral portion, the position detection system comprising:
a light source configured to generate measurement light;
three or more optical elements configured to emit the measurement light generated by the light source as emission light and receive reflected light,
wherein the three or more optical elements are located at three or more different circumferential positions with respect to the target object to provide three or more optical paths at the three or more different circumferential positions; and
a control unit configured to obtain interference spectra of the optical elements, determine whether or not interference caused by reflected light from the target object is detected in the interference spectra and determine whether or not the target object is located at a target position on the mounting table based on the interference determination,
wherein each of the optical elements is arranged such that the emission light is emitted to a target position of the peripheral portion of the target object.

6. A position detection system for use in a processing apparatus including a mounting table configured to mount thereon a disc-shaped target object having an inclined peripheral portion, the position detection system comprising:

a light source configured to generate measurement light;

three or more optical elements configured to emit the measurement light generated by the light source as emission light and receive reflected light, wherein the three or more optical elements are located at three or more different circumferential positions with respect to the target object to provide three or more optical paths at the three or more different circumferential positions; and a control unit configured to obtain interference spectra of the optical elements, determine whether or not interference caused by reflected light from the target object is detected in the interference spectra and determine whether or not the target object is located at a target position on the mounting table based on the interference determination, wherein each of the optical elements is arranged such that the emission light is emitted to a position inwardly separated from a target position of the peripheral portion of the target object by a predetermined distance.

7. A processing apparatus for processing a disc-shaped target object, comprising:

a mounting table configured to mount thereon the target object;

a focus ring provided to surround a periphery of the mounting table; and the position detection system of claim 1.

8. A processing apparatus for processing a disc-shaped target object having an inclined peripheral portion, comprising:

a mounting table configured to mount thereon the target object; and the position detection system of claim 5.

9. A processing apparatus for processing a disc-shaped target object having an inclined peripheral portion, comprising:

a mounting table configured to mount thereon the target object; and the position detection system of claim 6.

10. The position detection system of claim 1, wherein the processing apparatus includes an upper electrode above the focus ring and the optical elements are formed above the upper electrode, and wherein the driving unit has three or more actuators and the number of actuators is identical to the number of the optical elements.

11. The position detection system of claim 1, wherein the measurement light generated by the light source passes through the target object, and wherein the control unit is configured to obtain the positional relation based on interference of reflected light front a top surface and a rear surface of the focus ring and interference of reflected light from a top surface and a rear surface of the target object.

12. The position detection system of claim 5, wherein the control unit determines that the target object is located at the target position when the interference is not detected in the interference spectra of the optical elements and determines that the target object is not located at the target position when the interference is detected in at least one of the interference spectra of the optical elements.

13. The position detection system of claim 5, wherein the measurement light generated by the light source passes through the target object, and wherein the interference is caused by the reflected light from a top surface and a rear surface of the target object.

14. The position detection system of claim 6, wherein the control unit determines that the target object is located at the target position when the interference is detected in the interference spectra of the optical elements and determines that the target object is not located at the target position when the interference is not detected in at least one of the interference spectra of the optical elements.

15. The position detection system of claim 6, wherein the measurement light generated by the light source passes through the target object, and wherein the interference is caused by the reflected light from a top surface and a rear surface of the target object.

* * * * *